United States Patent
Mabuchi et al.

(10) Patent No.: US 9,391,111 B1
(45) Date of Patent: Jul. 12, 2016

(54) STACKED INTEGRATED CIRCUIT SYSTEM WITH THINNED INTERMEDIATE SEMICONDUCTOR DIE

(71) Applicant: OMNIVISION TECHNOLOGIES, INC., Santa Clara, CA (US)

(72) Inventors: Keiji Mabuchi, Los Altos, CA (US); Chih-Wei Hsiung, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/820,992

(22) Filed: Aug. 7, 2015

(51) Int. Cl.
*H01L 23/02* (2006.01)
*H01L 27/146* (2006.01)

(52) U.S. Cl.
CPC .... *H01L 27/14634* (2013.01); *H01L 27/14636* (2013.01); *H01L 27/14645* (2013.01)

(58) Field of Classification Search
CPC .............. H01L 23/4012; H01L 25/043; H01L 25/0756; H01L 25/117; H01L 2224/4503; H01L 2224/48091
See application file for complete search history.

(56) References Cited

U.S. PATENT DOCUMENTS

| | | |
|---|---|---|
| 8,716,097 B2 | 5/2014 | Bordelon, Jr. et al. |
| 8,957,358 B2 | 2/2015 | Wan et al. |
| 2012/0112311 A1* | 5/2012 | Cho ........................ H01L 23/62 257/529 |

OTHER PUBLICATIONS

Ogasahara, Y. et al., "Measurement of Supply Noise Suppression by Substrate and Deep N-well in 90nm Process," IEEE Asian Solid-State Circuits Conference, Nov. 3-5, 2008, Fukuoka, Japan, 2008 IEEE, pp. 397-400.

* cited by examiner

*Primary Examiner* — Hoai V Pham
(74) *Attorney, Agent, or Firm* — Blakely Sokoloff Taylor & Zafman LLP

(57) ABSTRACT

An intermediate integrated circuit die of a stacked integrated circuit system includes an intermediate semiconductor substrate including first polarity dopants is thinned from a second side. A first well including first polarity dopants is disposed in the intermediate semiconductor proximate to a first side. A second well including second polarity dopants is disposed in the intermediate semiconductor substrate proximate to the first side. A deep well having second polarity dopants is disposed in the intermediate semiconductor substrate beneath the first and second wells. An additional implant of first polarity dopants is implanted into the intermediate semiconductor substrate between the deep well and the second side of the intermediate semiconductor substrate to narrow a depletion region overlapped by the additional implant of first polarity dopants. The depletion region is between the deep well and the second side of the intermediate semiconductor substrate.

18 Claims, 4 Drawing Sheets

STACKED INTEGRATED CIRCUIT SYSTEM WITH THINNED INTERMEDIATE SEMICONDUCTOR DIE

BACKGROUND INFORMATION

1. Field of the Disclosure

The present invention relates generally semiconductor processing. More specifically, examples of the present invention are related to semiconductor processing of stacked integrated circuit systems.

2. Background

As integrated circuit technologies continue to advance, there are continuing efforts to increase performance and density, improve form factor, and reduce costs. The implementation of stacked three dimensional integrated circuits has been one approach that designers sometimes use to realize these benefits. The advances in wafer bonding with very precise alignments make it possible to fabricate stacked chips at a wafer-level. The possible applications could include logic chips that are bonded to memory chips, image sensor chips, among others. This offers the advantage of smaller form factors, improved performance, and lower costs.

A key challenge when implementing stacked three dimensional integrated circuit systems, in which there are continuing efforts to provide smaller, thinner and faster systems, relates to through silicon vias (TSVs) that have to penetrate the middle or intermediate silicon wafers of a 3 wafer stacked imaging systems. The increased thicknesses of the middle wafers decrease the yields of the through silicon vias and limit their density. For instance, the increased thicknesses of the middle wafers increase the aspect ratios of the through silicon vias in the middle wafers, which decreases yields and often requires more costly etch and fill processes.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
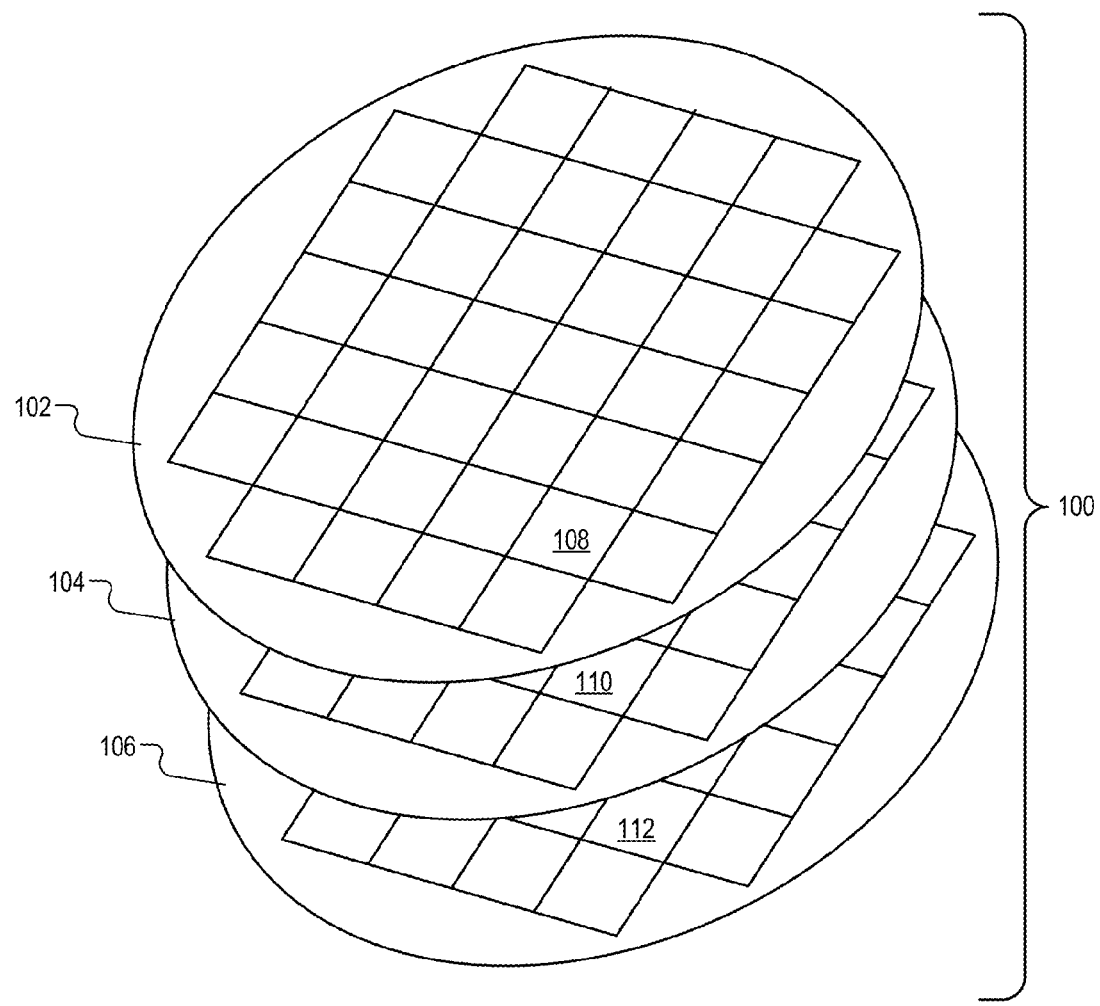
FIG. 1 is an exploded view of one example of stacked semiconductor wafers with integrated circuit dies of example stacked integrated circuit systems in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, an example triple stacked integrated circuit system in accordance with the teachings of the present invention includes an intermediate integrated circuit die having a semiconductor substrate that is thinned. In one example, the semiconductor substrate of the intermediate integrated circuit die includes an additional buried P-type implant between an N well and the back side surface of the semiconductor substrate, which makes the depletion region in the intermediate integrated circuit die shallower. As a result, the intermediate integrated circuit die can be thinner. For instance, in one example, the intermediate integrated circuit die may be thinned to 2.3 µm, instead of for example only 4 µm, with the additional buried P-type implant between an N well and the back side surface of the semiconductor substrate in accordance with the teachings of the present invention. In addition, it is appreciated that with the thinner intermediate integrated circuit die, smaller through silicon vias may be fabricated in the intermediate integrated circuit die at an acceptable yield, or same size through silicon vias may be fabricated in the intermediate integrated circuit die at an increased yield in accordance with the teachings of the present invention.

To illustrate, FIG. 1 is an exploded view of one example of triple stacked semiconductor wafers with integrated circuit dies of example triple stacked integrated circuit systems in accordance with the teachings of the present invention. In particular, FIG. 1 shows triple stacked wafers 100 includes an intermediate device wafer 104 disposed between a second device wafer 106 and a third device wafer 102.

Device wafers 104, 106, and 102 may include silicon, gallium arsenide, or other suitable semiconductor materials. In the illustrated example, a plurality of semiconductor dies, including intermediate integrated circuit die 110, are arranged on intermediate device wafer 104. A plurality of semiconductor dies, including second integrated circuit die 112, are arranged on second device wafer 106. A plurality of semiconductor dies, including third integrated circuit die 108, are arranged on third device wafer 102. In the example, the device wafers 104, 106, and 102 are wafer bonded together such that intermediate integrated circuit die 110 is bonded between second integrated circuit die 112 and third integrated circuit die 108 in accordance with the teachings of the present invention. As will be discussed in further detail below, in one example, the plurality of semiconductor dies, including intermediate integrated circuit die 110, on the intermediate device wafer 104 include an additional buried P-type implant between an N well and the back side surface of the semiconductor substrate to make the depletion region in the intermediate integrated circuit die shallower, which allow the plurality of semiconductor dies, including intermediate integrated circuit die 110, to be thinner in accordance with the teachings of the present invention.

As will be discussed in more detail below, in some examples, each one of the plurality of semiconductor dies arranged on third device wafer 102, including integrated circuit die 108, may include a pixel array. In addition, each one of the plurality of semiconductor dies arranged on the intermediate device wafer 104, including integrated circuit die 110, may include readout circuitry, such as for example analog to digital converter circuitry, memory array circuitry, etc. Furthermore, each one of the plurality of semiconductor dies arranged on second device wafer 106, including integrated circuit die 112, may include logic circuitry.

In the example, the placement of the pixel array, the readout circuitry, and the logic circuitry in stacked integrated circuit dies 110, 112, and 108 provide a triple stacked imaging system with a very high fill factor. In addition, since device wafers 104, 106, and 102 may be formed separately from each other, custom fabrication processes may be utilized to optimize the formation of the device wafers 104, 106, and 102 in accordance with the teachings of the present invention.

Figure 2:
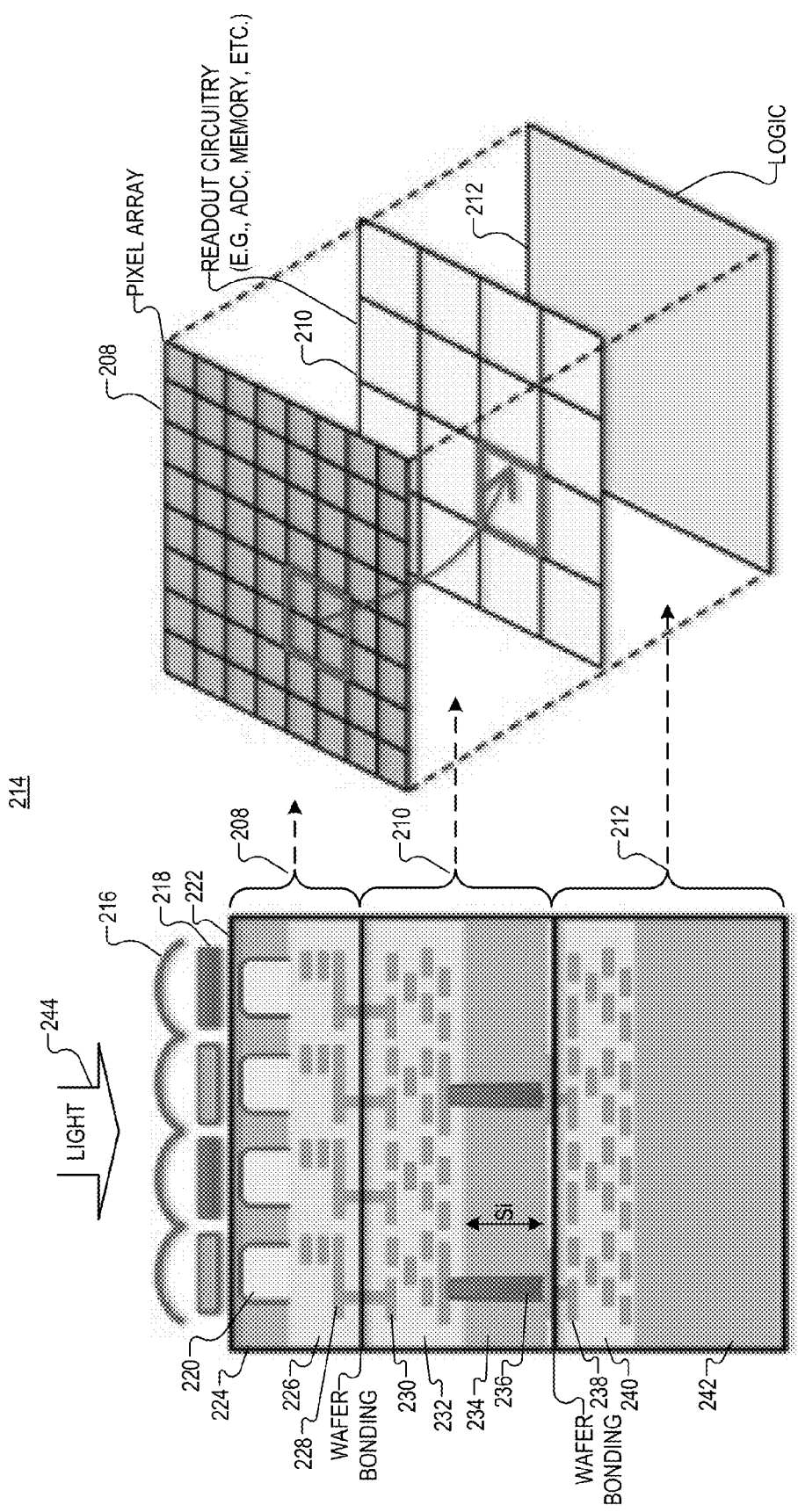
FIG. 2 is a cross-sectional view with a corresponding exploded isometric view of an example stacked integrated circuit system including a stacked imaging system with a thinned intermediate integrated circuit die in accordance with the teachings of the present invention.

FIG. 2 is a cross-sectional view with a corresponding exploded isometric view of an example stacked integrated circuit system 214 including a stacked imaging system with a thinned intermediate integrated circuit die in accordance with the teachings of the present invention. It is noted that stacked integrated circuit system 214 of FIG. 2 in one example is an example of stacked integrated circuit dies 110, 112, and 108 of FIG. 1, and that similarly named and numbered elements referenced below are coupled and function similar to as described above. In particular, as shown in the depicted example, stacked integrated circuit system 214 includes an intermediate integrated circuit die 210 that is wafer bonded between a second integrated circuit die 212 and a third integrated circuit die 208. In the example depicted in FIG. 2, the backside of intermediate integrated circuit die 210 is wafer bonded to the front side of third integrated circuit die, and the front side of intermediate integrated circuit die 210 is wafer bonded to the front side of third integrated circuit die 208.

As shown in the illustrated example, third integrated circuit die 208 includes a backside illuminated pixel array, which includes a plurality of photodiodes 200 that are arranged in a semiconductor substrate 224 of third integrated circuit die 208. The plurality of photodiodes 200 are illuminated with light 244 that is directed through an array of microlenses 216, through a color filter array 218, and through the back side 222 of the semiconductor substrate 224 to photogenerate image charge in the plurality of photodiodes 200 in response to the incident light 244.

In the example, the image charge that is photogenerated in each one of the plurality of photodiodes 200 is read out through conductors 228 that are disposed in one or more metal layers within a dielectric layer 226 of the third integrated circuit die 208 by readout circuitry included in intermediate integrated circuit die 210. As shown, conductors 230 included in one or more metal layers in a dielectric layer 232 of intermediate integrated circuit die 210 are coupled to conductors 228 of third integrated circuit die 208 to read out the image charge that is photogenerated in each one of the plurality of photodiodes 200. In one example, the readout circuitry included in intermediate integrated circuit die 210 may include analog to digital converter circuitry, memory array circuitry, or the like.

As will be discussed in further detail below, in one example, the semiconductor substrate 234 of the intermediate integrated circuit die 210 includes an additional buried P-type implant between an N well and the back side surface of the semiconductor substrate 234 to make the depletion region in the intermediate integrated circuit die shallower. As a result, the intermediate integrated circuit die 210 can be thinner in accordance with the teachings of the present invention.

In the depicted example, intermediate integrated circuit die 210 includes a plurality of through silicon vias 236 that extend through semiconductor substrate 234 of intermediate integrated circuit die 210 between conductors 230 included the dielectric layer 232 of intermediate integrated circuit die 210 and conductors 238 included in one or more metal layers in a dielectric layer 240 of second integrated circuit die 212. In one example, semiconductor substrate 234 of intermediate integrated circuit die 210 includes silicon. As shown in the depicted example, second integrated circuit die 212 also includes a semiconductor substrate 242, which in one example includes logic circuitry of stacked integrated circuit system 214. In one example, each one of the plurality of through silicon vias 236 that extend through semiconductor substrate 234 of intermediate integrated circuit die 210 are disposed outside of deep wells that are disposed in semiconductor substrate 234 of intermediate integrated circuit die 210.

Figures 3A, 3B:
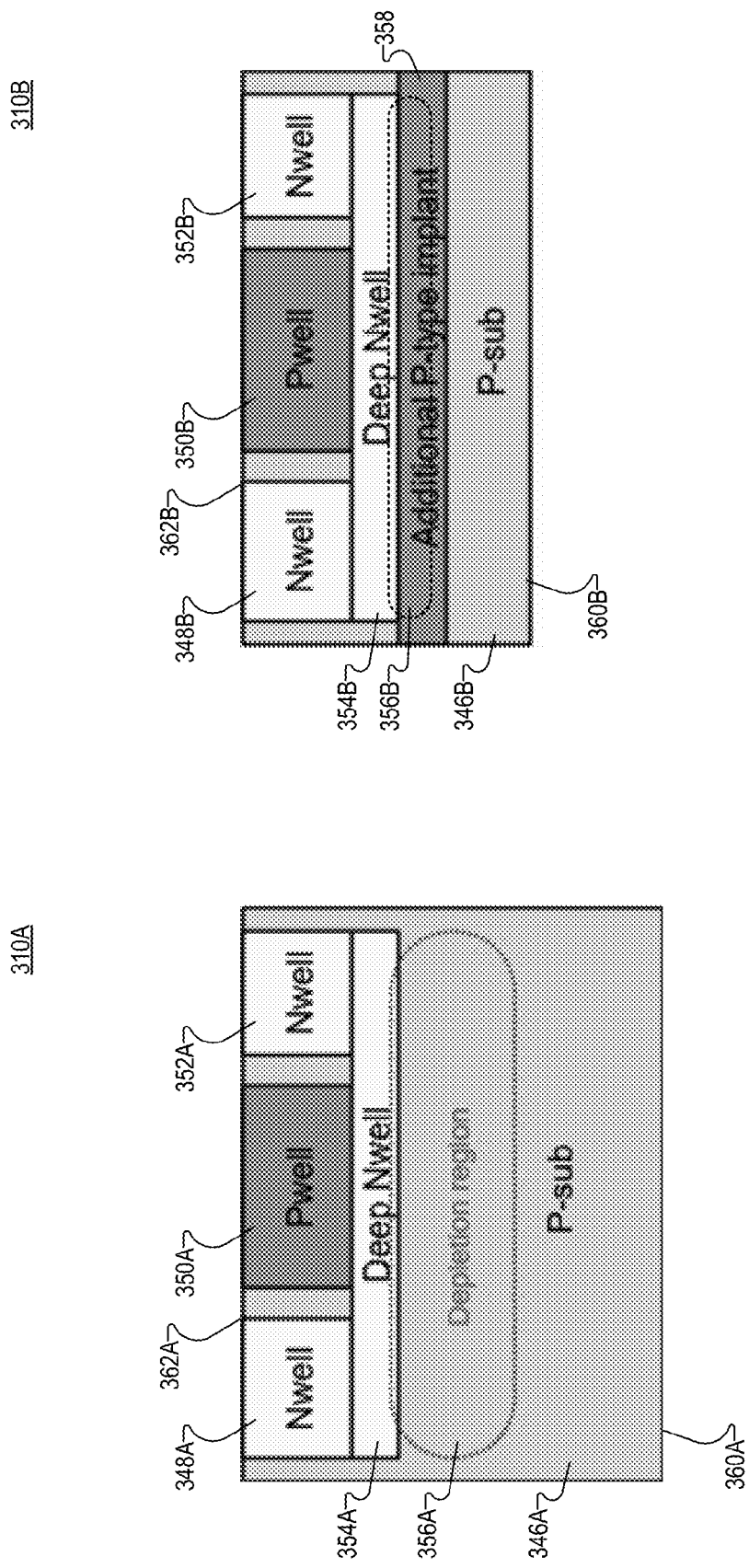
FIG. 3A is a cross-sectional view of one example of an intermediate integrated die with a depletion region that limits the thinning of the intermediate integrated circuit die.
FIG. 3B is a cross-sectional view of another example of an intermediate integrated die including an additional doped region implanted into the semiconductor material of the intermediate integrated die, which makes the depletion region more shallow, and therefore allows further thinning of the intermediate integrated die in accordance with the teachings of the present invention.

FIG. 3A is a cross-sectional view of one example of an intermediate integrated die 310A, which illustrates a depletion region 356A that limits the amount of thinning that can be performed on the intermediate integrated circuit die 310A. In particular, FIG. 3A shows that intermediate integrated die 310A includes a P doped semiconductor substrate 346A in which an N well 346A, a P well 350A, and an N well 352A are disposed proximate to a front side 362A of P doped semiconductor substrate 346A. In addition, a deep N well 354A is also formed beneath N well 346A, P well 350A, and N well 352A as shown, which forms depletion region 356A between deep N well 354A and a backside 360A of P doped substrate 346A. With depletion region 356A extending from deep N well 354A towards the backside 360A of P doped semiconductor substrate 346A, it is appreciated that the ability to thin intermediate integrated circuit die 310A is limited due to the increased leakage from deep N well 354A that would occur if there is excessive thinning of P doped semiconductor substrate 346A. As a consequence, P doped semiconductor substrate 346A is thicker, which results in a decreased yield and decreased density of through silicon vias (e.g., vias 236 of FIG. 2) through P doped semiconductor substrate 346A. In particular, the increased thickness of P doped semiconductor substrate 346A increases the aspect ratio of the through silicon vias through P doped semiconductor substrate 346A, which decreases yields and often requires more costly etch and fill processes.

FIG. 3B is a cross-sectional view of another example of an intermediate integrated die 310B including an additional doped region 358 implanted into the P doped semiconductor substrate 346B of the intermediate integrated die 310B, which narrows depletion region 356B making the depletion region 356B more shallow, and therefore allows further thinning of the intermediate integrated die 310B in accordance with the teachings of the present invention. It is noted that intermediate integrated die 310B of FIG. 3 may be an example of intermediate integrated die 210 of FIG. 2, or of intermediate integrated die 110 of FIG. 1, and that similarly named and numbered elements referenced below are coupled and function similar to as described above.

In particular, in one example, FIG. 3B illustrates an intermediate integrated circuit die 310B of a stacked integrated circuit system, such as for example a stacked imaging system. The example intermediate integrated circuit die 310B depicted in FIG. 3B includes an intermediate semiconductor substrate 346B that has a front side 362B and a backside 360B, which is opposite the front side 362B. In one example, the intermediate semiconductor substrate 346B is P doped and is thinned from the backside 360B in accordance with the teachings of the present invention.

In the depicted example, an N well 348B, a P well 350B, and an N well 352B are disposed in the intermediate semiconductor 346B proximate to the front side 362B of intermediate semiconductor substrate 346A. A deep N well 354B is disposed in the intermediate semiconductor substrate 346B beneath the N well 348B, P well 350B, and N well 352B such that N well 348A, P well 350B, and N well 352B are disposed between the front side 362B and the deep N well 354B. An additional implant 358 of P dopants is implanted into the intermediate semiconductor substrate 346B between the deep N 354B well and the backside 360B of the intermediate semiconductor substrate 346B. As a result, depletion region 356B overlaps the additional P type implant 358, which therefore narrows depletion region 356B between the deep N well 354B and the backside 360B of the intermediate semiconductor substrate 346B in accordance with the teachings of the present invention.

In one example, it is appreciated that because the depletion region 356B is narrowed by additional P type implant 358, therefore making depletion region 356B more shallow, the intermediate semiconductor substrate 346B may be thinned form the backside 360B to a thickness of for example 2.3 μm. For instance, in one example, without additional P type implant 358, it is appreciate that the intermediate semiconductor substrate 346B would only be able to be thinned form the backside 360B to a thickness of for example 4 μm, due to the potential leakage that would otherwise occur from the deep N well 354B.

With the thinner intermediate semiconductor substrate 346B, it is appreciated that an increased yield and increased density of through silicon vias (e.g., vias 236 of FIG. 2) through intermediate semiconductor substrate 346B may be realized with intermediate integrated circuit die 310B in accordance with the teachings of the present invention. In addition, it is appreciated with a thinner intermediate integrated circuit die 310B provided in accordance with the teachings of the present invention, a faster, smaller, and less costly stacked integrated circuit system including thinner intermediate integrated circuit die 310B may be realized in accordance with the teachings of the present invention.

Figure 4:
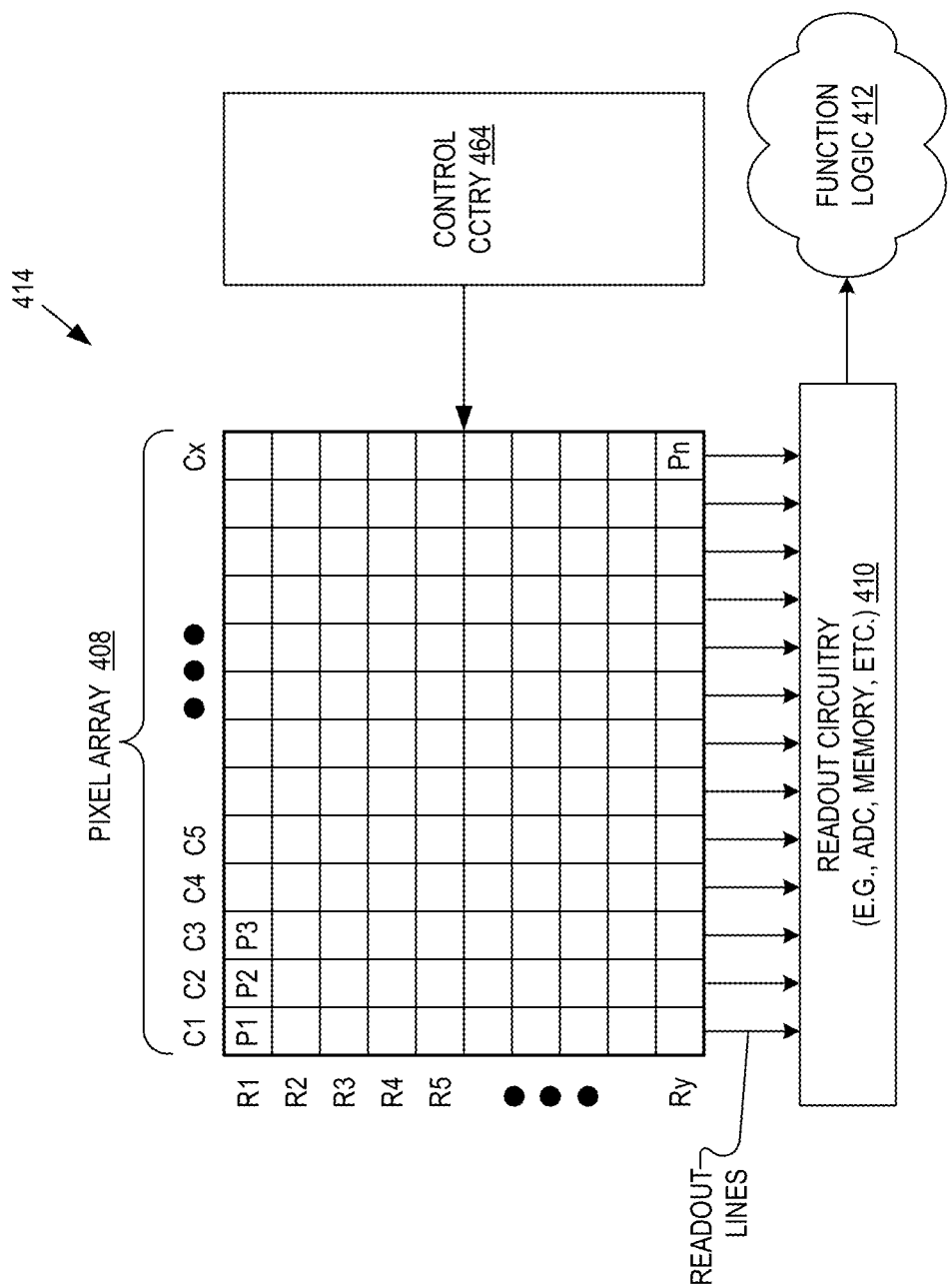
FIG. 4 is a block diagram showing one example of a stacked imaging system implemented with a thinned intermediate integrated circuit die in accordance with the teachings of the present invention.

FIG. 4 is a block diagram showing one example of a stacked imaging system 414 implemented with a thinned intermediate integrated circuit die including readout circuitry 410 in accordance with the teachings of the present invention. It is appreciated that the thinned integrated circuit die referenced in FIG. 4, may be one example of intermediate integrated die 310B of FIG. 3B, intermediate integrated die 210 of FIG. 2, or of intermediate integrated die 110 of FIG. 1, and that similarly named and/or numbered elements referenced below are coupled and function similar to as described above. In particular, FIG. 4 illustrates stacked imaging system 414 including an example pixel array 408 having a plurality of image sensor pixels included in an example stacked three dimensional integrated circuit having triple stacked integrated circuit dies, such as for example integrated circuit dies 210, 212, and 208 of FIG. 2, that are wafer bonded together in accordance with the teachings of the present invention. For instance, in one example, pixel array 408 may be included for example in integrated circuit die 208 of FIG. 2. As shown in the example, pixel array 408 is coupled to control circuitry 464 and readout circuitry 410, which may for example may be included in thinned intermediate integrated circuit die 210 of FIG. 2. As shown in the example, readout circuitry 410 is coupled to function logic 412, which may be included for example in integrated circuit die 212 of FIG. 2.

In one example, pixel array 408 is a two-dimensional (2D) array of image sensor pixels (e.g., pixels P1, P2, P3 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc.

In one example, after each pixel has acquired its image data or image charge, the image data is read out through readout lines by readout circuitry 410 and then transferred to function logic 412. In various examples, readout circuitry 410 may include amplification circuitry, analog-to-digital (ADC) conversion circuitry, memory array circuitry, or otherwise. Function logic 412 may simply store the image data or even manipulate the image data by applying post image effects (e.g., crop, rotate, remove red eye, adjust brightness, adjust contrast, or otherwise). In one example, readout circuitry 410 may readout a row of image data at a time along readout column lines (illustrated) or may readout the image data using a variety of other techniques (not illustrated), such as a serial readout or a full parallel readout of all pixels simultaneously.

In one example, control circuitry 464 is coupled to pixel array 408 to control operational characteristics of pixel array 408. In one example, control circuitry 464 may generate a shutter signal for controlling image acquisition. In one example, the shutter signal is a global shutter signal for simultaneously enabling all pixels within pixel array 408 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. An intermediate integrated circuit die of a stacked integrated circuit system, comprising:
    an intermediate semiconductor substrate including dopants having a first polarity, wherein the intermediate semiconductor substrate has a first side and a second side, wherein the second side is opposite the first side, wherein the intermediate semiconductor substrate is thinned from the second side;
    a first well disposed in the intermediate semiconductor proximate to the first side, wherein the first well includes dopants having the first polarity;
    a second well disposed in the intermediate semiconductor substrate proximate to the first side, wherein the second well includes dopants having a second polarity;
    a deep well disposed in the intermediate semiconductor substrate beneath the first and second wells, wherein the first and second wells are disposed between the first side and the deep well, wherein the deep well includes dopants having the second polarity; and
    an additional implant of dopants having the first polarity implanted into the intermediate semiconductor substrate between the deep well and the second side of the intermediate semiconductor substrate to narrow a depletion region overlapped by the additional implant of dopants, wherein the depletion region is between the deep well and the second side of the intermediate semiconductor substrate.

2. The intermediate integrated circuit die of claim 1 further comprising a third well disposed in the intermediate semiconductor substrate proximate to the first side, wherein the third well includes dopants having the second polarity, wherein the first, second, and third wells are disposed between the first side and the deep well.

3. The intermediate integrated circuit die of claim 1 wherein the intermediate semiconductor substrate is thinned from the second side to a thickness of 2.3 μm.

4. The intermediate integrated circuit die of claim 1 further comprising a metal layer disposed in a dielectric layer disposed on the first side of the intermediate semiconductor substrate.

5. The intermediate integrated circuit die of claim 4 further comprising a plurality vias extending through the intermediate semiconductor substrate, wherein the plurality of vias are disposed outside of the deep well and are coupled between respective conductors in the metal layer disposed in the dielectric layer disposed on the first side and respective conductors in a second integrated circuit die of the stacked integrated circuit system, wherein the second integrated circuit die is bonded to the intermediate integrated circuit die proximate to the second side of the intermediate semiconductor substrate.

6. The intermediate integrated circuit die of claim 5 wherein conductors in the metal layer disposed in the dielectric layer disposed on the first side of the intermediate semiconductor substrate are coupled to respective conductors in a third integrated circuit die of the stacked integrated circuit system, wherein the third integrated circuit die is bonded to the intermediate integrated circuit die proximate to the first side of the intermediate semiconductor substrate such that the intermediate integrated circuit die is bonded between the second integrated circuit die and the third integrated circuit die of the stacked integrated circuit system.

7. The intermediate integrated circuit die of claim 6 wherein the stacked integrated circuit system includes a stacked imaging system, wherein the third integrated circuit die includes a pixel array of a stacked imaging system, wherein the intermediate integrated circuit die includes readout circuitry of the stacked imaging system, and wherein the second integrated circuit die includes logic circuitry of the stacked imaging system.

8. The intermediate integrated circuit die of claim 1 wherein the first side of the intermediate semiconductor substrate is a front side of the intermediate semiconductor substrate, and wherein the second side of the intermediate semiconductor substrate is a back side of the intermediate semiconductor substrate.

9. The intermediate integrated circuit die of claim 1 wherein the dopants having the first polarity include P type dopants, and wherein the dopants having the second polarity include N type dopants.

10. A stacked imaging system, comprising:
    an intermediate integrated circuit die, including:
        an intermediate semiconductor substrate including dopants having a first polarity, wherein the intermediate semiconductor substrate has a first side and a second side, wherein the second side is opposite the first side, wherein the intermediate semiconductor substrate is thinned from the second side;
        a first well disposed in the intermediate semiconductor proximate to the first side, wherein the first well includes dopants having the first polarity;
        a second well disposed in the intermediate semiconductor substrate proximate to the first side, wherein the second well includes dopants having a second polarity;
        a deep well disposed in the intermediate semiconductor substrate beneath the first and second wells, wherein the first and second wells are disposed between the first side and the deep well, wherein the deep well includes dopants having the second polarity; and
        an additional implant of dopants having the first polarity implanted into the intermediate semiconductor substrate between the deep well and the second side of the intermediate semiconductor substrate to narrow a depletion region overlapped by the additional implant of dopants, wherein the depletion region is between the deep well and the second side of the intermediate semiconductor substrate;
    a second integrated circuit die bonded to the intermediate integrated circuit die proximate to the second side of the intermediate semiconductor substrate; and
    a third integrated circuit die bonded to the intermediate integrated circuit die proximate to the first side of the intermediate semiconductor substrate such that the intermediate integrated circuit die is bonded between the second integrated circuit die and the third integrated circuit die.

11. The stacked imaging system of claim 10 wherein the third integrated circuit die includes a pixel array of the stacked imaging system, wherein the intermediate integrated circuit die includes readout circuitry of the stacked imaging system, and wherein the second integrated circuit die includes logic circuitry of the stacked imaging system.

12. The stacked imaging system of claim 10 wherein the intermediate integrated circuit die further includes a third well disposed in the intermediate semiconductor substrate proximate to the first side, wherein the third well includes dopants having the second polarity, wherein the first, second, and third wells are disposed between the first side and the deep well.

13. The stacked imaging system of claim 10 wherein the intermediate semiconductor substrate is thinned from the second side to a thickness of 2.3 µm.

14. The stacked imaging system of claim 10 wherein the intermediate integrated circuit die further includes a metal layer disposed in a dielectric layer disposed on the first side of the intermediate semiconductor substrate.

15. The stacked imaging system of claim 14 wherein the intermediate integrated circuit die further includes a plurality vias extending through the intermediate semiconductor substrate, wherein the plurality of vias disposed outside of the deep well and are coupled between respective conductors in the metal layer disposed in the dielectric layer disposed on the first side and respective conductors in the second integrated circuit die.

16. The stacked imaging system of claim 15 wherein the conductors in the metal layer disposed in the dielectric layer disposed on the first side of the intermediate semiconductor substrate are coupled to respective conductors in the third integrated circuit die.

17. The stacked imaging system of claim 10 wherein the first side of the intermediate semiconductor substrate is a front side of the intermediate semiconductor substrate, and wherein the second side of the intermediate semiconductor substrate is a back side of the intermediate semiconductor substrate.

18. The stacked imaging system of claim 10 wherein the dopants having the first polarity include P type dopants, and wherein the dopants having the second polarity include N type dopants.

* * * * *